(12) United States Patent
Wangler et al.

(10) Patent No.: US 6,885,434 B2
(45) Date of Patent: Apr. 26, 2005

(54) DIAPHRAGM FOR AN INTEGRATOR UNIT

(75) Inventors: Johannes Wangler, Königsbronn (DE); Markus Degünther, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/777,109

(22) Filed: Feb. 13, 2004

(65) Prior Publication Data

US 2004/0160591 A1 Aug. 19, 2004

Related U.S. Application Data

(63) Continuation of application No. PCT/EP02/08180, filed on Jul. 23, 2002.

(30) Foreign Application Priority Data

Aug. 15, 2001 (DE) .......................................... 101 38 847

(51) Int. Cl.[7] ........................ G03B 27/72; G03B 27/42; G03B 27/54
(52) U.S. Cl. ............... 355/71; 355/53; 355/67
(58) Field of Search ............... 355/53, 67, 71; 359/227

(56) References Cited

U.S. PATENT DOCUMENTS

| | | | |
|---|---|---|---|
| 5,473,408 A | 12/1995 | Hoffman et al. | |
| 5,601,733 A | 2/1997 | Partlo | |
| 5,675,401 A | 10/1997 | Wangler et al. | |
| 5,982,558 A | 11/1999 | Fürter et al. | |
| 6,349,005 B1 | 2/2002 | Schuster et al. | |
| 6,366,410 B1 | 4/2002 | Schultz et al. | |
| 6,377,336 B1 * | 4/2002 | Shiraishi et al. | 355/67 |
| 6,522,484 B1 | 2/2003 | Schuster | |
| 2002/0149855 A1 | 10/2002 | Schuster | |
| 2002/0196419 A1 | 12/2002 | Mizouchi | |
| 2003/0007253 A1 | 1/2003 | Schuster et al. | |

FOREIGN PATENT DOCUMENTS

| | | |
|---|---|---|
| EP | 0633506 | 6/1994 |
| EP | 1154330 | 5/2001 |
| JP | 11260716 | 9/1999 |
| JP | 2000243681 | 9/2000 |

OTHER PUBLICATIONS

"Diaphragm at quartz–rod entrance for I–line scanners", Research Disclosure, Kenneth Mason Publications, Hampshire, Great Britain, Jul. 1999, p. 939.

* cited by examiner

*Primary Examiner*—Alan Mathews
(74) *Attorney, Agent, or Firm*—Walter Ottesen (57) ABSTRACT

The invention relates to a diaphragm (1) for an integrator unit of a microlithographic projection exposure system. The diaphragm (1) includes a diaphragm opening (3), which is symmetrical with respect to a first axis of symmetry (5). The widths of the diaphragm aperture (3) in the direction of the axis of symmetry (5) are dependent on the distance (y) from the first axis of symmetry (5). The widths are greater than or equal to the width at y=0. The diaphragm (1), together with a cylindrical integrator, forms an integrator unit, which is located in an illumination system.

19 Claims, 3 Drawing Sheets

DIAPHRAGM FOR AN INTEGRATOR UNIT

RELATED APPLICATION

This application is a continuation application of international patent application number PCT/EP 02/08180, filed Jul. 23, 2002, and claiming priority from German patent application 101 38 847.0, filed Aug. 15, 2001, the entire content of said applications being incorporated herein by reference.

FIELD OF THE INVENTION

The invention relates to a diaphragm having a diaphragm opening with the diaphragm being especially for an integrator unit of a microlithographic projection exposure system.

BACKGROUND OF THE INVENTION

Diaphragms of the above kind in illumination systems for microlithographic projection exposure systems are known, for example, from U.S. Pat. No. 5,473,408. In the illumination system shown here for a microlithographic projection exposure system, a reflecting diaphragm having a circularly-shaped diaphragm opening is mounted directly ahead of a rod integrator. On the one hand, light can enter into the rod integrator via the diaphragm opening and, on the other hand, light, which is reflected back from the reticle and again arrives in the rod integrator, is reflected an additional time at the reflecting diaphragm surface and is again supplied to the useful light. The diaphragm opening has a diameter which is significantly less than the height of the rod.

U.S. Pat. No. 5,601,733 likewise discloses diaphragms which are mounted forward of a rod integrator. As shown in U.S. Pat. No. 5,473,408, the diaphragms are provided with a reflecting surface on the side, which faces toward the rod integrator, in order to again supply to the useful light the light which is reflected back into the rod integrator from the illumination system. A laser having a low "etendue" (phase space volume) is used as a light source. For this reason, the light can be focused with the condenser optics onto the diaphragm so that the light passes through the diaphragm opening without vignetting and the diaphragm opening has a diameter as small as possible.

Illuminating systems for microlithography with rod integrators are also disclosed in U.S. Pat. No. 5,675,401. A mercury high pressure lamp is used here as a light source. In addition to a virtual spherically-shaped emission characteristic, such light sources have a finite expansion so that they have a significantly greater etendue compared to laser light sources. In U.S. Pat. No. 5,675,401, a condenser optic focuses the light onto the entry surface of the rod integrator and generates a light spot there. This light spot is round as long as the light source has an expansion, which is rotationally symmetrical to the optical axis, and the optical components in the condenser optic have rotationally symmetrical optical effects. Precisely in wafer scanners, rod integrators are used whose entry surface has a high aspect ratio of rod width to rod height, for example, an aspect ratio of 2:1 or greater. Here, it can happen that the expansion of the light spot is greater than the height of the rod. This leads to the situation that the light is vignetted. As a rule, however, the ray angles, which occur at the entry surface, are dependent upon the spacing from the optical axis. For this reason, the vignetting leads to a so-called elliptical pupil illumination. An elliptical pupil illumination is understood to mean the intensity distributions in the pupil planes which, in the quadrants arranged about a horizontal axis, have a greater total intensity than in the quadrants arranged about a vertical axis and therefore lead to a different resolution capacity for horizontal and vertical structures in the imaging of horizontal and vertical structures with projection objectives used in microlithography.

SUMMARY OF THE INVENTION

In view of the above, it is an object of the invention to improve illuminating systems incorporating rod integrators.

The integrator unit of the invention is for a microlithographic projection exposure system defining a beam path along which light passes in a light direction. The integrator unit includes: a rod integrator arranged in the beam path; a diaphragm mounted in the beam path forward of the rod integrator with respect to the light direction; and, the diaphragm including: a diaphragm body; the diaphragm body having a diaphragm opening formed therein; the diaphragm opening being symmetrical to a first symmetry axis extending in x-direction; the diaphragm opening having widths in the x-direction which are dependent upon a distance (y) from the first symmetry axis; and, the widths being greater than or equal to the width of the diaphragm opening at y=0.

The diaphragm defined above is arranged in the light direction ahead of the rod integrator. With this diaphragm, the light spot on the entry surface of the rod integrator can be so vignetted that, at high in-coupling efficiency, pupil illuminations are nonetheless ensured at low ellipticity downstream of the rod integrator. The in-coupling efficiency is given by the ratio of the surface of the diaphragm opening to the surface of the light spot. The ellipticity of a pupil illumination is a scalar quantity and is determined in that the ratio of the total intensities of the quadrants, which are arranged about a horizontal axis, and the total intensities of the quadrants, which are arranged about a vertical axis, is formed. The quadrants are delimited by two straight lines which intersect at the center of the pupil illumination and are perpendicular to each other and each includes an angle of 45° to the horizontal direction. In this way, the ellipticity is equal to the ratio of a first integral (wherein there is an integration over all points of the intensity distribution and whose x-values are greater in magnitude than the y-values) and a second integral (wherein there is an integration over all points of the intensity distribution whose y-values are greater in magnitude than the x-values) with the ellipticity being given by:

$$Ellipticity = \frac{\int_{|x|>|y|} I(x,y)\,dx\,dy}{\int_{|y|>|x|} I(x,y)\,dx\,dy} \cdot 100\%$$

The x-axis points in the horizontal direction and the y-axis points in the vertical direction. Pupil illuminations without ellipticity have an ellipticity equal to 1.0, that is 100%.

In order to achieve pupil illuminations with low ellipticity at high in-coupling efficiency, the diaphragm has a diaphragm opening which is symmetrical to a first symmetry axis which points in the x-direction. In this way, it is achieved that the light spot is vignetted symmetrically with respect to this symmetry axis. The width of the diaphragm opening, which is measured in the x-direction, is dependent upon the distance y from the symmetry axis. The diaphragm opening has the lowest width at y=0.

The widths of the diaphragm opening are therefore greater or equal to the width at y=0. Whereas the width continuously reduces to zero with an increasing distance y for a circular diaphragm opening, the diaphragm of the invention has a width at a distance y from the symmetry axis which is at least as great as the width at y=0 or even greater. This diaphragm is mounted forward of the rod integrator whose rod width is measured in the x-direction and whose rod height is measured in the y-direction. As a rule, the rod width is greater than the rod height. In addition, the diameter of the light spot should be greater than the height of the rod. In this case, the light spot can be cut with the diaphragm so that the width of the light spot is about equal to the height of the light spot which results from vignetting at the upper or lower edge of the diaphragm opening or at the entry surface of the rod integrator depending upon whether the diaphragm opening or the rod integrator has a lesser height. If the angular distribution at the entry surface of the rod integrator is dependent upon the spacing from the optical axis, then the parts of the light spot can be vignetted in the x-direction which are cut in the y-direction by the diaphragm opening or the entry surface of the rod integrator. Without the diaphragm, elliptical pupil illuminations would result in a pupil plane downstream of the rod integrator.

With the diaphragm of the invention, the ellipticity of the pupil illumination downstream of the rod integrator can be significantly reduced. A pupil plane downstream of the integrator can, for example, be the exit pupil of the rod integrator or a pupil plane within an objective mounted downstream of the rod integrator in the direction of light. A pupil plane forward of the rod integrator can, for example, be the entry pupil of the rod integrator or a pupil plane within an objective mounted forward of the rod integrator. If the pupil illumination ahead of the rod integrator is a so-called multipole illumination, which is characterized by several illuminated regions separated from each other, then, with the use of the diaphragm according to the invention, the condition is achieved that the total intensities of the individual regions of the pupil illumination downstream of the rod integrator are almost in the same ratio to each other as the total intensities of the individual regions of the pupil illumination forward of the rod integrator. Possible multipole illuminations are, for example, the dipole illumination with two separated regions or the quadrupole illumination with four separated regions.

If, in the following, reference is made to achieving pupil illuminations with reduced ellipticity or pupil illuminations without ellipticity, this means, with reference to the multipole illuminations, that the ratios of the total illuminations of the individual regions of the multipole illumination do not change significantly with respect to each other or the ratios remain equal to each other.

According to another feature of the invention, the diaphragm opening has an effective height $H_{B1}$ which is virtually equal to the width at y=0. A deviation of 10% is, however, tolerable. With this condition, the vignetted light spot has an almost equal expansion in each of the x- and y-directions. If the diaphragm is mounted forward of a rod integrator, then the upper and lower limiting lines at the entry surface act as the upper and lower limiting lines of the diaphragm opening when the diaphragm opening has a greater physical height than the entry surface of the rod integrator. The effective height of the diaphragm is, in this case, given by the rod height. The phrase "the effective height $H_{B1}$ of the diaphragm opening" will be understood in the following to be the value which is the lesser in the comparison of the physical height of the diaphragm opening and the rod height. A diaphragm whose diaphragm opening has the same physical height as the rod height causes the same effect with respect to the rod integrator as a diaphragm whose diaphragm opening is greater than the rod height.

As a rule, the angular distribution at the entry surface of the rod integrator is dependent only upon the distance from the optical axis. For this reason, one obtains a pupil illumination without ellipticity with a circular diaphragm opening whose diameter is equal to the rod height as long as no other factors influence the pupil illumination. Circular diaphragm openings have, however, the disadvantage that they vignette a significant portion of the light spot. A pupil illumination without ellipticity is likewise achieved with quadratic diaphragm openings. The in-coupling efficiency of a diaphragm having a quadratic diaphragm opening is greater by a factor $4/\pi$ than for a corresponding diaphragm with a circular diaphragm opening.

In order to further increase the in-coupling efficiency of the diaphragm, it is advantageous when the diaphragm opening has greater widths at the upper and lower edges than in the center at y=0. The ratio of a second width $B_2$ at $y=H_{B1}/2$ to a first width at y=0 should then be less than 2.0 and should especially lie between 1.4 and 1.7. The widths of the diaphragm opening should be greater than or equal to the first width $B_1$ and less than or equal to the second width $B_2$. This form of the diaphragm opening, which becomes wider upwardly and downwardly starting from the first axis of symmetry, leads again to slightly elliptical pupil illuminations but also to a marked increase of the in-coupling efficiency. The maximum width at the upper edge of the diaphragm opening is dependent upon the tolerable ellipticity of the pupil illumination.

In an advantageous embodiment of the diaphragm, the diaphragm opening has a constant first width from y=0 to a pregiven distance $y_0$ which is greater than one quarter of the diaphragm height and less than half the diaphragm height. Only starting from the pregiven distance $y_0$, does the width of the diaphragm opening increase up to the upper edge of the diaphragm opening. The widths can increase stepwise or continuously. For a continuous increase, the left edge or the right edge of the diaphragm opening between the pregiven distance $y_0$ and $y=H_{B1}/2$ can be described by a line, by a circular arc or by a polynomial.

For keeping the ellipticity of the pupil illumination within tolerable limits, it is advantageous when the pregiven distance $y_0$ is set into relationship to the first width $B_1$, to the second width $B_2$ and to the height $H_{B1}$ of the diaphragm opening. Preferably, these quantities satisfy the following condition:

$$\frac{H_{B1} - (2 \cdot y_0)}{B_2 - B_1} > 0.6.$$

With this condition, it is achieved that the widths of the diaphragm opening do not increase too greatly toward the edge.

It is especially advantageous when the widths increase linearly between the pregiven distance $y_0$ and the upper edge of the diaphragm opening. In this way, triangularly-shaped additional areas are added to the central quadratic diaphragm opening at all four corners which areas increase the in-coupling efficiency and introduce only a slight ellipticity of the pupil illumination. The edge lines between the pregiven distance $y_0$ and the upper edge of the diaphragm opening should enclose an angle to the y-axis between 0° and 60°, especially between 30° and 60°, so that the ellipticity of the pupil illumination remains within tolerable limits.

In order to hold the ellipticity of the pupil illumination as low as possible, it is further advantageous that the diaphragm opening has a symmetry axis in the y-direction in addition to the symmetry axis in the x-direction.

The width of the diaphragm opening at y=0 should amount to between 2 mm and 30 mm, especially between 4 mm and 20 mm, in order to adapt to the dimensions of the rod integrators which are typical for the illumination system in microlithography.

The dimensions of the diaphragm opening are adapted to the downstream integrator. The distance between the diaphragm and the entry surface is given by the mechanical edge constraints of the frames of the components. The diaphragm can also be mounted forward of the rod integrator so as to be exchangeable. It is also possible to place the diaphragm, for example, directly on the entry surface via a non-transparent coating. The diaphragm can, however, also be imaged on the entry surface of the rod integrator with an imaging optical system. On the side facing toward the rod integrator, the diaphragm can also have a coating reflecting at the operating wavelength in order to be able to use the advantages described, for example, in U.S. Pat. No. 5,473,408. The rod integrator can be configured as a hollow tube or a glass rod.

The application of the diaphragm and the integrator unit is not limited to microlithographic projection exposure systems. Rather, integrator units of this kind can be generally used in illuminating systems which operate with rod integrators as homogenizers and place high requirements on the pupil illumination. For example, the use is also possible in illuminating systems for wafer inspection systems, for exposure systems for manufacturing flat panel displays, for projectors or for microscopes.

Elliptical pupil illuminations occur primarily when the entry surface of the rod integrator is rectangular and the light spot (within which the angular distribution is dependent upon the distance from the optical axis) is vignetted differently at the entry surface in the x- and y-directions. The use of the diaphragm of the invention is therefore advantageous when the ratio of rod width and rod height amounts to at least 1.5. In microlithographic projection exposure systems, side aspect ratios in the range of 2:1, 4:1, up to 10:1 are typical. Additionally, the width of the diaphragm opening at y=0 should be about equal to the rod height so that the light spot exhibits about the same expansion in the x-direction and y-direction after the diaphragm. The effective height of the diaphragm should be equal to the rod height, that is, the physical height of the diaphragm should at least be equal to the rod height or greater.

A condenser optic is usually mounted between the light source and the integrator unit and this condenser optic includes all optical components between the light source and the integrator unit. The condenser optic collects the light of the light source and focuses the same on the entry surface of the rod integrator and there generates a light spot. The condenser optics can include a zoom objective and/or axicon lenses in order to influence the angular distribution at the entry surface of the rod integrator and therefore also the form and expansion of the pupil illumination. The use of diffractive lenses is possible in the condenser optics. The optical components of the condenser optics usually have an optical effect rotationally symmetrical to the optical axis. If the expansion of the light source and the emission characteristic of the light source are also rotationally symmetrical to the optical axis, then the form of the light spot is round and the angular distribution at the entry surface is only dependent upon the distance from the optical axis. If the diameter of the light spot is greater than the rod height, then elliptical pupil illuminations occur after the rod integrator without diaphragm at an aspect ratio of the entry surface greater than 1:1. With the diaphragm described above, it is possible to achieve ellipticities less than 10%, especially less than 5% even when the diameter of the light spot is 150% greater than the rod height.

This reduction of the ellipticity is reached with simultaneously high in-coupling efficiency. The in-coupling efficiency is advantageously greater than with the use of a diaphragm having a circular diaphragm opening whose diameter is equal to the rod height, especially greater by more than $4/\pi$ and especially greater by more than 1.3.

The illumination system described above is advantageously used in microlithographic projection exposure systems which, in addition to the illumination system, include a projection objective which images a mask carrying a structure onto a light-sensitive substrate. Here, resolutions of less than 300 nm are obtained so that especially high requirements are imposed on the pupil illumination.

Semiconductor components, inter alia, can be manufactured with this microlithographic projection exposure system.

The invention is also directed to a method for exposing light-sensitive substrates as it is utilized, for example, in the manufacture of semiconductor components.

The light beam is generated by a light source, for example, a plasma light source or a mercury-vapor lamp. This light beam is at least partially taken up by a condenser optic. The condenser optic includes a first pupil plane wherein a first pupil illumination is generated by the light beam. This first pupil illumination exhibits no ellipticity when the condenser optics include optical components whose optical effects are rotationally symmetrical to the optical axis and when the light source exhibits an emission characteristic rotationally symmetrical to the optical axis. The emission characteristic is given by the distribution of the ray angles to the optical axis.

The optical components of the condenser optic, which are mounted downstream of the first pupil plane, focus the light bundle on a light spot on an entry surface of a rod integrator.

The light spot is almost round when the light source has an expansion rotationally symmetrical to the optical axis. In contrast to the light spot, the entry surface of the rod integrator is not round but is, as a rule, rectangular. The entry surface includes a first expansion and a second expansion which are measured in mutually perpendicular directions. Especially in scanner systems, the second expansion is at least greater by a factor of 1.5 than the first expansion. Depending upon the expansion of the light source, the light spot can have a diameter which is greater than the first diameter and especially 150% and 400% greater than the first expansion. In this way, the light spot is differently vignetted at the entry surface in the direction of the first expansion and in the direction of the second expansion. The angular distribution at the entry surface is, as a rule, dependent only on the distance from the optical axis. For this reason, this leads to the situation that rays having different angles with respect to the optical axis arrive in the rod integrator in the direction of the first expansion and the second expansion.

The light spot is vignetted with a diaphragm which is mounted after the condenser optic and ahead of the rod integrator. The diaphragm opening has a form which departs from the form of the light spot and the cross section of the entry surface of the rod integrator.

Within the rod integrator, the light beam is homogenized so that an almost homogeneous intensity distribution is generated at the exit surface of the rod integrator. In the proximity of the exit surface, that is, at a defocusing of a few millimeters, a masking system is mounted which is imaged by an objective on a first field plane. With the masking system, the field illumination in the first field plane can be variably and sharply delimited. The objective includes a second pupil plane having a second pupil illumination. Without the diaphragm forward of the rod integrator, the second pupil illumination would exhibit a marked ellipticity when the diameter of the light spot is significantly greater than the second expansion of the entry surface of the rod integrator. The ellipticity can be reduced to less than 10%, especially less than 5%, with the diaphragm.

A mask carrying a structure is mounted in the first field plane and this mask is imaged by the projection objective onto a second field plane. A light sensitive substrate is mounted in the second field plane and is exposed as soon as the light beam impinges upon the light-sensitive substrate. Without the diaphragm, structures of the mask orientated in the direction of the first expansion of the entry surface and in the direction of the second expansion of the entry surface would be imaged at differently large resolution values when the pupil illumination in the second pupil plane exhibits an ellipticity. Only with the diaphragm and the reduction of the ellipticity associated therewith is an imaging with homogeneous resolution values possible.

A diaphragm having the features mentioned in the description of the arrangement is especially used in the method.

The listing of the method steps is not final but gives only the steps which are required for reducing the ellipticity. Rather, additional method steps are to be used which are generally known and usual for the exposure procedure.

BRIEF DESCRIPTION OF THE DRAWINGS

The invention will now be described with reference to the drawings wherein.

DESCRIPTION OF THE PREFERRED
EMBODIMENTS OF THE INVENTION

Figure 1:
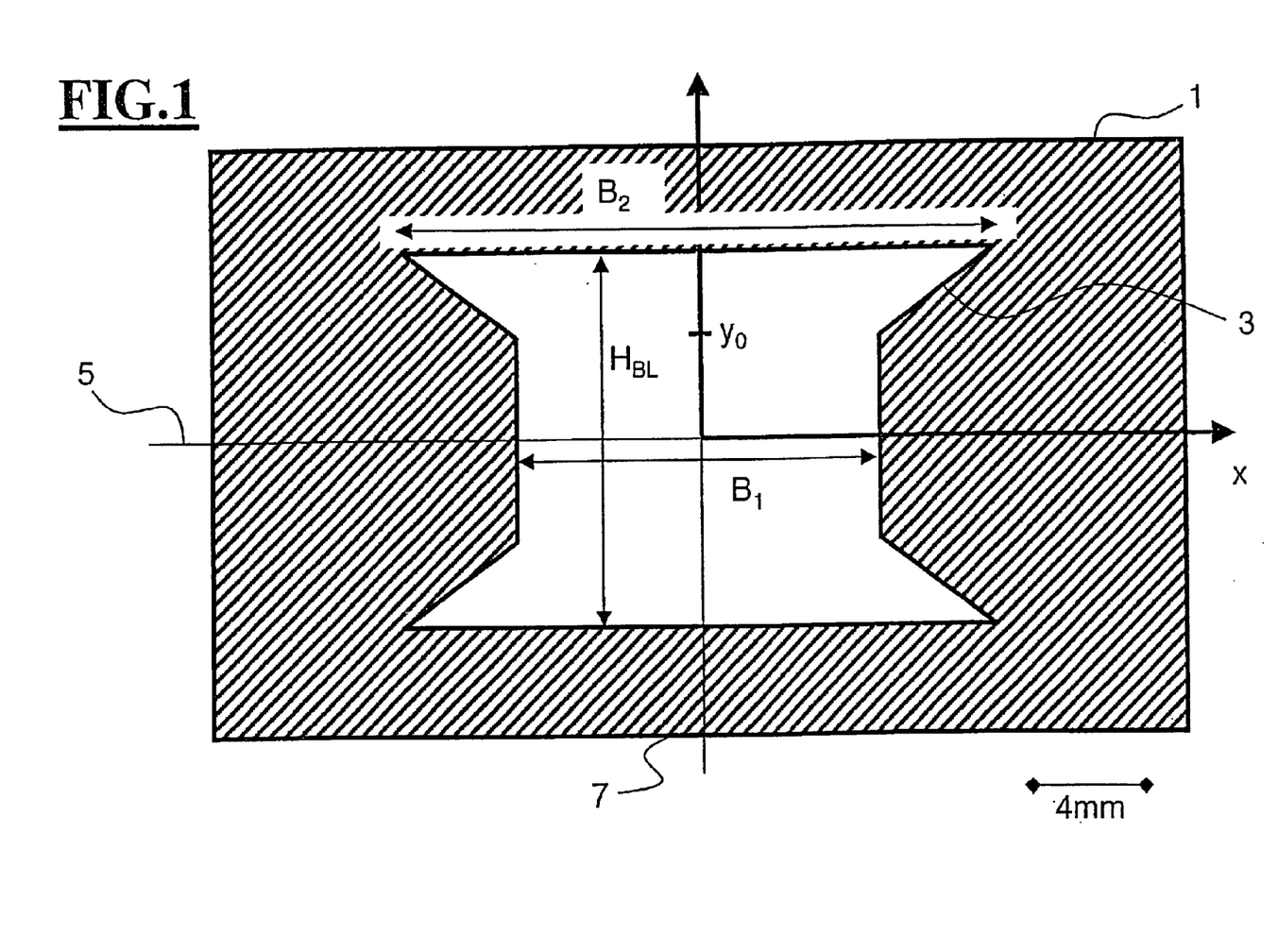
FIG. 1 is a plan view of a diaphragm according to the invention.

FIG. 1 shows an embodiment for a diaphragm 1 in accordance with the invention. The diaphragm 1 includes a diaphragm opening 3 which is symmetrical to a first symmetry axis 5 and symmetrical to a second symmetry axis 7. The origin of an x-y coordinate system lies at the center of the diaphragm opening 3. The first symmetry axis 5 points in the x-direction and the second symmetry axis 7 points in the y-direction. The height $H_{BL}$ of the diaphragm opening 3 is 13 mm. The width of the diaphragm opening 3 is dependent upon the distance y from the symmetry axis 5. At y=0, the width $B_1$ is $B_1$=13 mm in the embodiment of FIG. 1 and is equal to the height $H_{BL}$ of the diaphragm opening. The diaphragm opening 3 has a constant width of 13 mm up to the elevation $y_0$=3.5 mm. The width of the diaphragm opening increases linearly between the elevation $y_0$=3.5 mm and the upper edge of the diaphragm opening 3. The width $B_2$ at the upper edge of the diaphragm opening 3 is $B_2$=21 mm at y=$H_{BL}$/2=6.5 mm so that the ratio of the width $B_2$ and the width $B_1$ is equal to 1.6. The edge line of the diaphragm opening 3 between the elevation $y_0$ and the upper edge of the diaphragm opening 3 encloses an angle of 53.1° with the y-axis. The ratio between the difference of the height $H_{BL}$ and double the value of the elevation $y_0$ and the difference of the width $B_2$ and the width $B_1$ is:

$$\frac{H_{BI} - (2 \cdot y_0)}{B_2 - B_1} = \frac{13 \text{ mm} - (2 \cdot 3.5 \text{ mm})}{21 \text{ mm} - 13 \text{ mm}} = 0.75.$$

Figure 2:
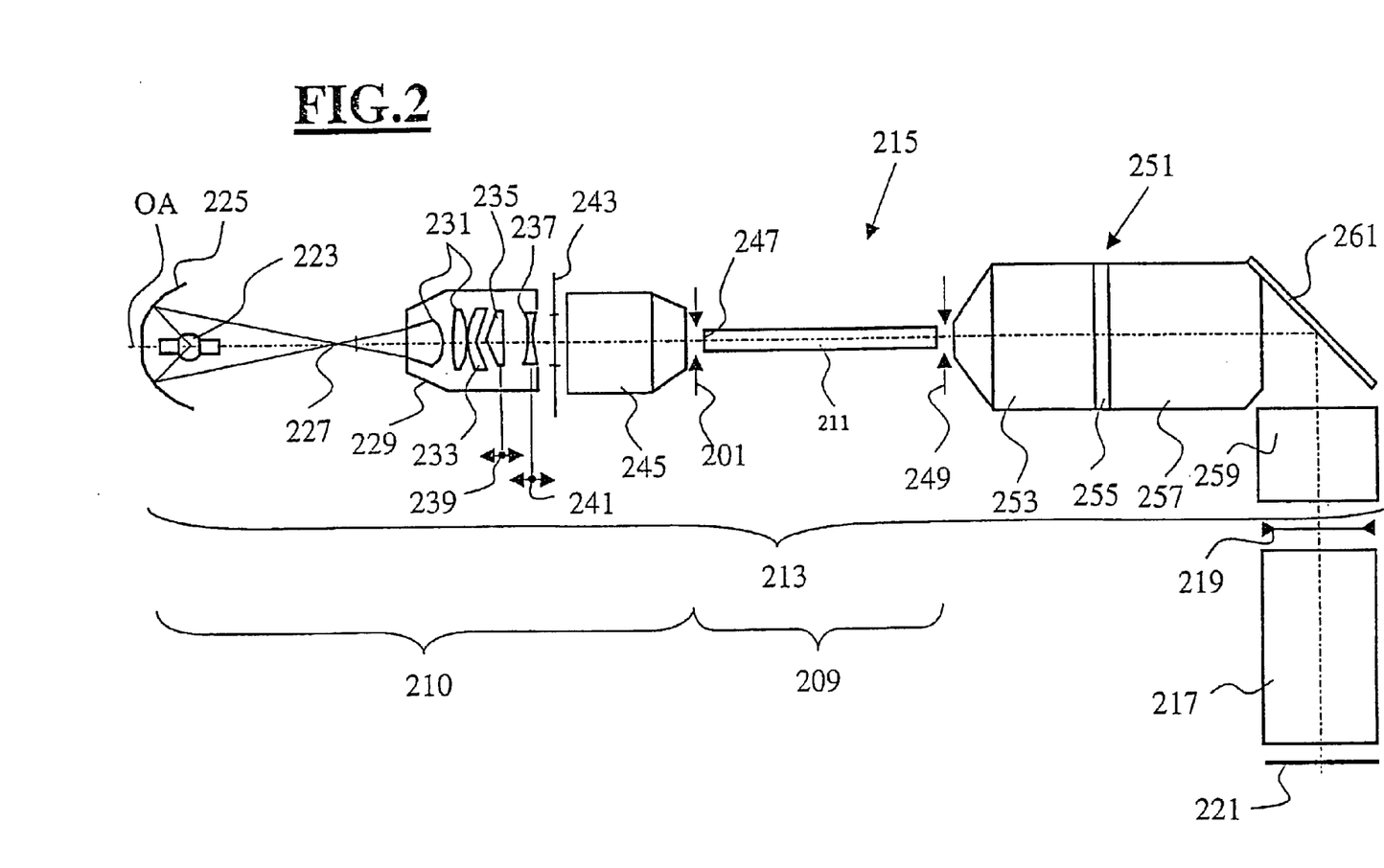
FIG. 2 is a schematic representation of a microlithographic projection exposure system; and, FIG. 3 is a schematic showing the definition of the ellipticity of the pupil illumination.

In FIG. 2, the use of the diaphragm 1 is shown in a microlithographic projection exposure system. The diaphragm in FIG. 2 is identified by reference numeral 201. The microlithographic projection exposure system 215 includes the illumination system 213, the mask 219 carrying the structure, the projection objective 217 and the light-sensitive substrate 221. The light source 223 in the illuminating system 213 is a mercury discharge lamp and is mounted in one of the two focal points of an elliptical mirror 225 which collects the emitted light at the second focal point 227.

The next objective 229 comprises: a first lens group 231; the concave first axicon lens 233; the convex second axicon lens 235; and, a second lens group 237. Positioning means 239 and 241 permit an axial displacement of the axicon lens 235 and an optical element of the second lens group 237. In this way, the distance of the axicon lenses (233, 235) to each other and, therefore, the annular field character of the pupil illumination in the pupil intermediate plane 243 can be changed and a zoom action for changing the diameter of the pupil illumination (that is, the degree of coherence σ) can be achieved. Embodiments for the objective 229 are shown in U.S. Pat. No. 5,675,401 incorporated herein by reference. A second objective 245 follows the pupil intermediate plane 243. With the second objective 245, the light is focused on the diaphragm 201. The collector mirror 225, the objective 229 and the objective 245 conjointly form the condenser optic 210 which has exclusively optical components having optical effects rotationally symmetrical to the optical axis.

The condenser optic 210 images the light source 223 on the diaphragm 201. The diaphragm 201 is mounted directly ahead of the entry surface 247 of the rod integrator 211 which is configured as a quartz rod. The diaphragm 201 and the rod integrator 211 define the integrator unit 209.

The output of the rod integrator 211 is an intermediate field plane wherein a masking system (REMA) 249 is mounted. The following REMA-objective 251 images the masking system 249 on the mask 219 carrying the structure (reticle, lithographic input) and contains the following: a first lens group 253, a pupil plane 255, second and third lens groups (257 and 259) and a deflecting mirror 261 therebetween. Embodiments for the REMA objective 251 are disclosed in U.S. Pat. No. 5,982,558 and in U.S. Pat. No. 6,366,410 incorporated herein by reference.

The mask 219, which carries structure, is imaged by the projection objective 217 on the light-sensitive substrate 221. An embodiment for the projection objective 217 is disclosed in United States patent application publication 2003/0007253 incorporated herein by reference. The mask 219 carrying the structure as well as the light-sensitive substrate 221 are carried by a positioning and change unit not shown which, in addition to the exchange of elements, also permits scanning of the elements during the exposure.

The diaphragm 201 is adapted to the dimensions of the rod integrator 211. The entry surface 247 of the rod integrator 211 has a rod width $B_{S1}$=28 mm and the rod height $H_{S1}$=13 mm. The rod width is measured in the x-direction and the rod height is measured in the y-direction. The length of the rod integrator is 800 mm in order to ensure an adequate homogenization of the light. The width $B_1$ of the diaphragm 201 at y=0 and the height $H_{BL}$ are thereby equal to the rod height $H_{S1}$. The diaphragm 201 could also have a larger physical height because the light spot in this case would be vignetted by the upper and lower boundary lines of the entry surface 247. The distance of the diaphragm 201 to the rod integrator 211 is 0.5 mm.

In the following, it will be shown how the use of the diaphragm 201 influences the ellipticity of the pupil illumination. For this purpose, the diaphragm 201 is first removed from the illuminating system 213. In this embodiment, the light arc of the light source 223 has a length of 4 mm and a diameter of 6 mm. The light rays, which are emitted by the light source 223, have an angle of between 60° and 135° with respect to the optical axis OA. The light arc is imaged by the condenser optic 210 on the entry surface 247 and generates a light spot having a maximum diameter of 41 mm which is thereby greater than the rod height by 315%. The rays have a maximum angle of 18° with reference to the optical axis OA. The diameter of the light spot and the ray angles at the entry surface are dependent upon the position of the zoom lenses and the axicon lenses (233, 235) in the objective 229. In this example, the axicon lenses (233, 235) are closed and the objective 229 has a focal length of 77 mm. The rear focal plane of the objective 229 is close to the location of the second focal point 227 of the mirror 225 and the forward focal plane is close to the location of the pupil intermediate plane 243. The focal length of the objective 245 is 90 mm. The rearward focal point is close to the location of the pupil intermediate plane 243 and the forward focal point is close to the location of the diaphragm 201. The rod integrator 211 generates a homogeneous field illumination at its exit surface and this field illumination is imaged by the REMA objective 251 on the mask 219 carrying structure. Following the field plane with the masking system 249 and after the lens group 253 having the focal length 123 mm, the pupil plane 255 of the REMA objective 251 follows. The pupil illumination is viewed in the pupil plane 255 as intensity distribution I(x,y). The rearward focal plane of the lens group 253 is disposed close to the location of the masking system 249 and the forward focal plane is close to the location of the pupil plane 255.

Figure 3:
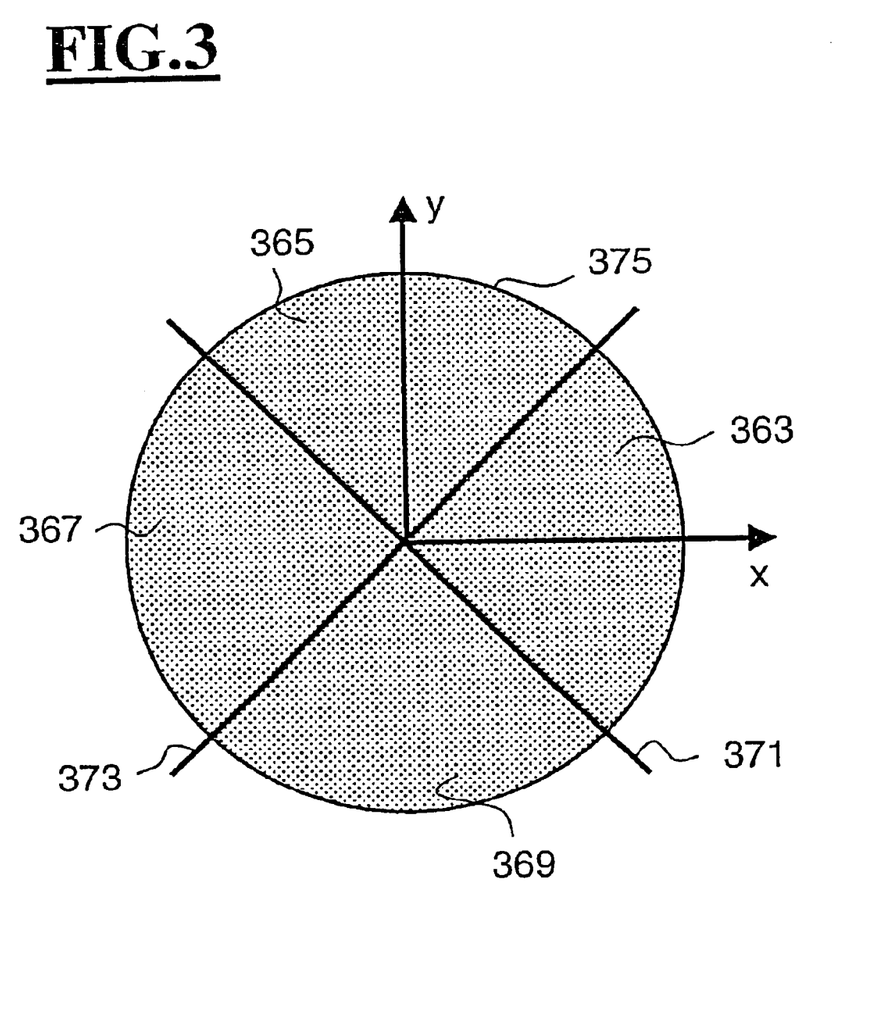

The definition of the ellipticity of the pupil illumination is shown in FIG. 3. The pupil illumination 375 is not homogeneous as shown schematically in FIG. 3; rather, the pupil illumination exhibits a grating of separated light spots because of the coverage of the entry surface 247 of the rod integrator 211 which is not complete in the y-direction. For determining the ellipticity, the total intensities are determined in the four quadrants (363, 365, 367, 369). The quadrants are bounded by the straight lines 371 and 373 which are each at 45° to the y-axis. The ellipticity is now equal to the quotient from the total intensities in the quadrants 363 and 367 and the total intensities in the quadrants 365 and 369:

$$Ellipticity = \frac{\int_{363} I(x,y)\,dx\,dy + \int_{367} I(x,y)\,dx\,dy}{\int_{365} I(x,y)\,dx\,dy + \int_{369} I(x,y)\,dx\,dy} \cdot 100\%$$

Without the use of the diaphragm, the ellipticity of the pupil illumination in the pupil plane 255 is 19%. If a circular diaphragm is mounted ahead of the rod integrator 211, which has the diameter equal to the rod height $H_{SI}$=13 mm, then the ellipticity vanishes. With the use of the circular diaphragm, one loses, however, 48% of the total intensity compared to an integrator unit 209 which has no diaphragm ahead of the entry surface. The in-coupling efficiency of the circular diaphragm is 10.1%.

The ellipticity of the pupil illumination likewise vanishes with a quadratic diaphragm whose height and width are equal to the rod height $H_{S1}$=13 mm. With a quadratic diaphragm, one loses only 37% of the total intensity compared to an integrator unit 209 without diaphragm. The in-coupling efficiency of the quadratic diaphragm is 12.8%.

With the diaphragm 201, the ellipticity of the pupil illumination is 2.5%. The ellipticity is significantly lower and has a more tolerable value compared to an integrator unit 209 without diaphragm (ellipticity 19%). With the diaphragm 201, one loses only 32% of the total intensity compared to an integrator unit 209 without diaphragm. The in-coupling efficiency of the diaphragm 201 is 14.6%. Compared to a circular diaphragm, the in-coupling efficiency is greater by a factor of 1.45. The total intensity is greater by a factor of 1.3 than for an integrator unit having a circular diaphragm.

Starting from the diaphragm 201, the edge line of the diaphragm opening can be so modified that, for increased requirements as to the ellipticity of the pupil illumination, tolerable values for the ellipticity result. For example, the inclination angle of the edge line can be reduced between the elevation $y_0$ and the upper edge of the diaphragm opening. It is also possible to increase the value for the elevation $y_0$.

Lower values for the ellipticity result also when the edge line is not linear between the elevation $y_0$ and the upper edge of the diaphragm opening; rather, it forms an arc so that the widths of the diaphragm opening in this region are less than in the diaphragm 201.

With the embodiments for a diaphragm, which is mounted forward of a rod integrator, it has been shown that it is possible, at high efficiency, to achieve pupil illuminations which exhibit almost no ellipticity.

It is understood that the foregoing description is that of the preferred embodiments of the invention and that various changes and modifications may be made thereto without departing from the spirit and scope of the invention as defined in the appended claims.

What is claimed is:

1. An integrator unit for a microlithographic projection exposure system defining a beam path along which light passes in a light direction, the integrator unit comprising:
   a rod integrator arranged in said beam path;
   a diaphragm mounted in said beam path forward of said rod integrator with respect to said light direction; and,
   said diaphragm including:
   a diaphragm body;
   said diaphragm body having a diaphragm opening formed therein;
   said diaphragm opening being symmetrical to a first symmetry axis extending in x-direction;
   said diaphragm opening having widths in said x-direction which are dependent upon a distance (y) from said first symmetry axis; and,
   said widths being greater than or equal to the width of said diaphragm opening at y=0.

2. The integrator unit of claim 1, wherein said diaphragm opening has an effective height ($H_{BL}$) which is about equal to said width at y=0.

3. The integrator unit of claim 2, wherein said diaphragm opening has a first width ($B_1$) at y=0 and a second width ($B_2$)

at y=$H_{BL}$/2; said first width ($B_1$) and said second width ($B_2$) define a ratio having a value lying between 1.0 and 2.0; and, the widths of said diaphragm opening being greater than or equal to said first width ($B_1$) and less than or equal to said second width ($B_2$).

4. The integrator unit of claim 2, wherein said diaphragm opening has a first width ($B_1$) at y=0 and a second width ($B_2$) at y=$H_{BL}$/2; said first width ($B_1$) and said second width ($B_2$) define a ratio having a value lying between 1.4 and 1.7; and, the widths of said diaphragm opening being greater than or equal to said first width ($B_1$) and less than or equal to said second width ($B_2$).

5. The integrator unit of claim 4, wherein said diaphragm opening has a constant width from y=0 to a pregiven distance $y_0$, which is greater than $H_{BL}$/4 and less than $H_{BL}$/2.

6. The integrator unit of claim 5, wherein the ratio of the difference between the effective height ($H_{BL}$) and twice the value of said distance ($y_0$) to the difference of said second width ($B_2$) and said first width ($B_1$) is 0.6.

7. The integrator unit of claim 5, wherein the width of said diaphragm opening increases linearly between said distance $y_0$ and y=$H_{BL}$/2.

8. The integrator unit of claim 1, wherein said diaphragm opening is symmetrical to a second symmetry axis perpendicular to said first symmetry axis.

9. The integrator unit of claim 1, wherein the width of said diaphragm opening at y=0 has values lying between 2 mm and 30 mm.

10. The integrator unit of claim 1, wherein the width of said diaphragm opening at y=0 has values lying between 4 mm and 20 mm.

11. The integrator unit of claim 1, wherein said distance (y) extends in a y-direction perpendicular to said x-direction; and, said rod integrator has a rectangular entry surface having a rod width in said x-direction and a rod height in said y-direction; and, the ratio of said rod width to said rod height is at least 1.5 and the width of said diaphragm opening at y=0 is about equal to said rod height.

12. An illuminating system for a microlithographic projection exposure system defining a beam path along which light passes in a light direction, the illuminating system comprising:

a light source for generating said light for travel along said beam path; and, an integrator unit including:

a rod integrator arranged in said beam path;

a diaphragm mounted in said beam path forward of said rod integrator with respect to said light direction; and, said diaphragm including:

a diaphragm body;

said diaphragm body having a diaphragm opening formed therein;

said diaphragm opening being symmetrical to a first symmetry axis extending in x-direction;

said diaphragm opening having widths in said x-direction which are dependent upon a distance (y) from said first symmetry axis; and, said widths being greater than or equal to the width of said diaphragm opening at y=0.

13. The illuminating system of claim 12, further comprising:

a condenser optic mounted forward of said integrator unit with respect to said light direction and being configured to illuminate said diaphragm with a light spot having a diameter greater than the height of said rod integrator;

a pupil plane downstream of said integrator unit viewed in said light direction;

a pupil illumination having an ellipticity; and, said diaphragm vignetting said light spot so as to cause said ellipticity to be less than 10%.

14. The illuminating system of claim 13, wherein said ellipticity is less than 5%.

15. The illuminating system of claim 13, wherein said diaphragm has an in-coupling efficiency which is greater than for a diaphragm having a circular diaphragm opening whose diameter is equal to said rod height.

16. A microlithographic projection exposure system defining a beam path along which light passes in a light direction, said system comprising:

an illuminating system including: a light source for generating said light for travel along said beam path; and, an integrator unit including: a rod integrator arranged in said beam path; a diaphragm mounted in said beam path forward of said rod integrator with respect to said light direction; and, said diaphragm including: a diaphragm body; said diaphragm body having a diaphragm opening formed therein; said diaphragm opening being symmetrical to a first symmetry axis extending in x-direction; said diaphragm opening having widths in said x-direction which are dependent upon a distance (y) from said first symmetry axis; and, said widths being greater than or equal to the width of said diaphragm opening at y=0; and, a projection objective for imaging a mask carrying a structure onto a light-sensitive substrate.

17. A method for exposing a light-substrate including for producing semiconductor components, the method comprising the steps of:

generating a light beam utilizing a light source;

collecting said light beam with a condenser optic and illuminating a first pupil plane in said condenser optic with a first pupil illumination having no ellipticity;

focussing said light beam to a light spot on an entry surface of a rod integrator utilizing said condenser optic with said light spot being approximately round and having a diameter;

wherein said entry surface has a first expansion in a first direction and a second expansion in a second direction perpendicular to said first direction and said second expansion being greater than said first expansion by a factor of 1.5 and said diameter of said light spot is greater than said first expansion;

vignetting said light spot with a diaphragm which is mounted forward of said rod integrator;

homogenizing said light beam with said rod integrator and generating a homogeneous field illumination at a masking system mounted downstream of said rod integrator;

imaging said masking system onto a first field plane with an objective and generating a second pupil illumination in a second pupil plane of said objective with said second pupil illumination having an ellipticity of less than 10%;

mounting a mask carrying structure in the first field plane;

imaging said mask carrying structure onto a second field plane utilizing a projection objective; and, arranging a light-sensitive substrate in said second field plane and exposing the light-sensitive substrate.

18. The method of claim 17, wherein said ellipticity is less than 5%.

19. The method of claim 17, wherein said light spot is vignetted utilizing a diaphragm including:
- a diaphragm body;
- said diaphragm body having a diaphragm opening formed therein;
- said diaphragm opening being symmetrical to a first symmetry axis extending in x-direction;
- said diaphragm opening having widths in said x-direction which are dependent upon a distance (y) from said first symmetry axis; and,
- said widths being greater than or equal to the width of said diaphragm opening at y=0.

* * * * *